(12) United States Patent
Lee et al.

(10) Patent No.: US 12,176,324 B2
(45) Date of Patent: Dec. 24, 2024

(54) LIGHT EMITTING APPARATUS USING SEMICONDUCTOR LIGHT-EMITTING DEVICE

(71) Applicant: LG ELECTRONICS INC., Seoul (KR)

(72) Inventors: Kyungho Lee, Seoul (KR); Yangwoo Byun, Seoul (KR); Hooyoung Song, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 701 days.

(21) Appl. No.: 17/418,066

(22) PCT Filed: Oct. 29, 2019

(86) PCT No.: PCT/KR2019/014352
§ 371 (c)(1),
(2) Date: Jun. 24, 2021

(87) PCT Pub. No.: WO2020/138685
PCT Pub. Date: Jul. 2, 2020

(65) Prior Publication Data
US 2022/0102323 A1    Mar. 31, 2022

(30) Foreign Application Priority Data

Dec. 26, 2018    (KR) .................. 10-2018-0169630

(51) Int. Cl.
*H01L 25/075*    (2006.01)
*H01L 33/60*    (2010.01)
(Continued)

(52) U.S. Cl.
CPC .......... *H01L 25/0753* (2013.01); *H01L 33/60* (2013.01); *H01L 33/62* (2013.01); *H01L 33/42* (2013.01)

(58) Field of Classification Search
None
See application file for complete search history.

(56) References Cited

U.S. PATENT DOCUMENTS

2002/0063521 A1    5/2002    Salam
2008/0179602 A1*   7/2008    Negley ................ H01L 27/156
                                                               438/34
(Continued)

FOREIGN PATENT DOCUMENTS

EP    3 193 075 A1    7/2017
JP    2011-14878 A    1/2011
(Continued)

*Primary Examiner* — Feifei Yeung Lopez
(74) *Attorney, Agent, or Firm* — Birch, Stewart, Kolasch & Birch, LLP

(57) ABSTRACT

A light emitting apparatus includes a plurality of wiring electrodes, a plurality of semiconductor light emitting devices connected between two of the plurality of wiring electrodes, and a reflection layer of metal disposed under the plurality of semiconductor light emitting devices, wherein the plurality of wiring electrodes are connected in series with each other by the plurality of semiconductor light emitting devices, and at least one of the plurality of semiconductor light emitting devices is connected between two consecutive wiring electrodes among the plurality of wiring electrodes.

20 Claims, 13 Drawing Sheets

(51) Int. Cl.
*H01L 33/62* (2010.01)
*H01L 33/42* (2010.01)

(56) References Cited

U.S. PATENT DOCUMENTS

| | | |
|---|---|---|
| 2010/0301731 A1 | 12/2010 | Morikawa et al. |
| 2011/0204387 A1* | 8/2011 | Kim ..................... H01L 27/156 |
| | | 257/E33.072 |
| 2011/0254022 A1 | 10/2011 | Sasano |
| 2012/0069567 A1 | 3/2012 | Wu |
| 2015/0188090 A1 | 7/2015 | Yonehara et al. |
| 2015/0372072 A1* | 12/2015 | Xiong ................ H10K 59/1315 |
| | | 438/46 |
| 2017/0205057 A1 | 7/2017 | Winkler et al. |
| 2020/0203587 A1* | 6/2020 | Kim ..................... H01L 27/156 |

FOREIGN PATENT DOCUMENTS

| | | |
|---|---|---|
| JP | 2011-171739 A | 9/2011 |
| JP | 2014-140076 A | 7/2014 |
| KR | 10-2006-0124003 A | 12/2006 |
| KR | 10-2009-0119862 A | 11/2009 |
| KR | 10-1154706 B1 | 6/2012 |
| KR | 10-2015-0046153 A | 4/2015 |

\* cited by examiner

[FIG. 1]
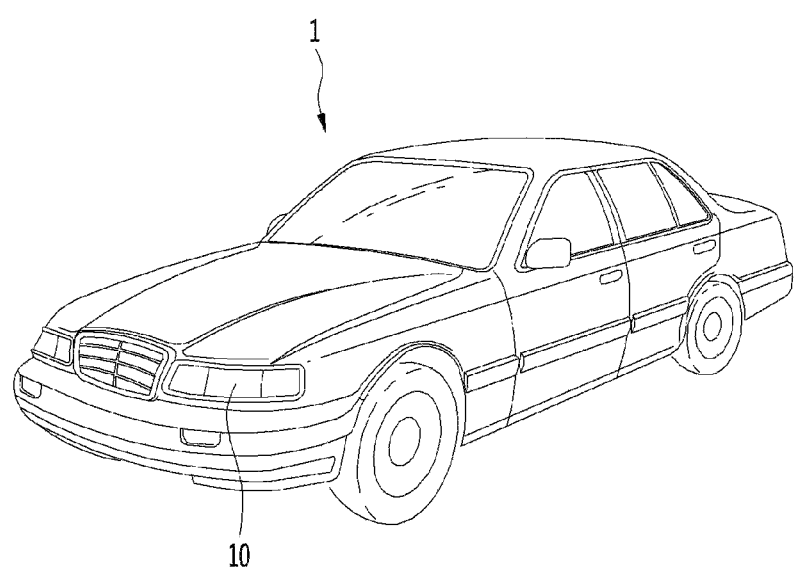

[FIG. 2]
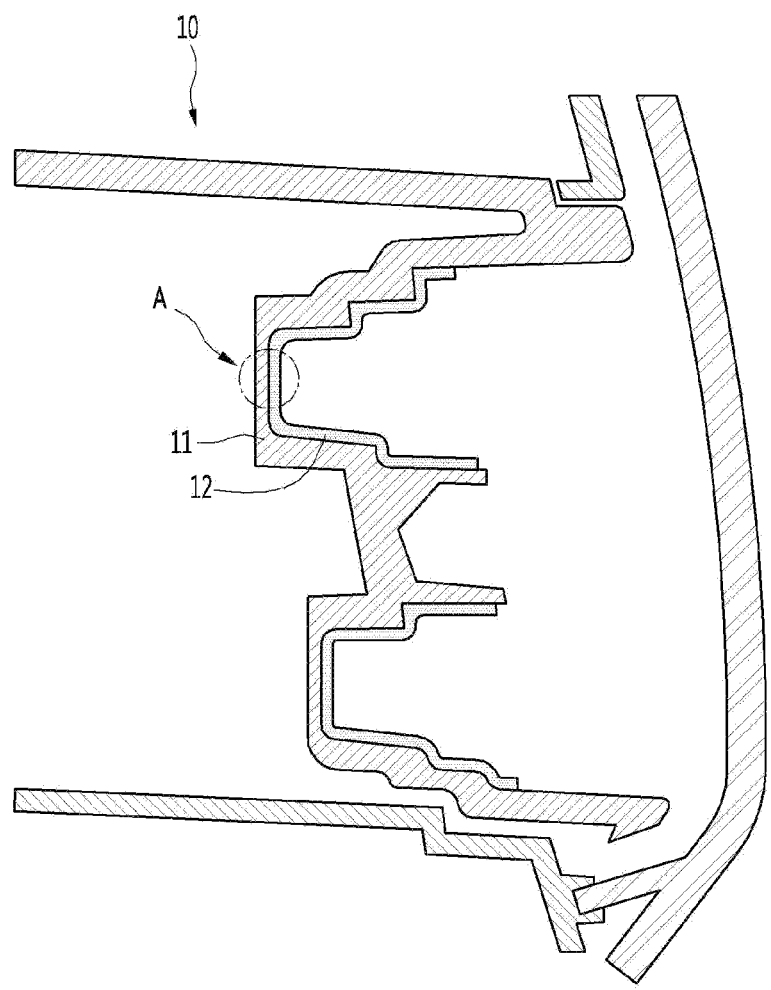

[FIG. 3]
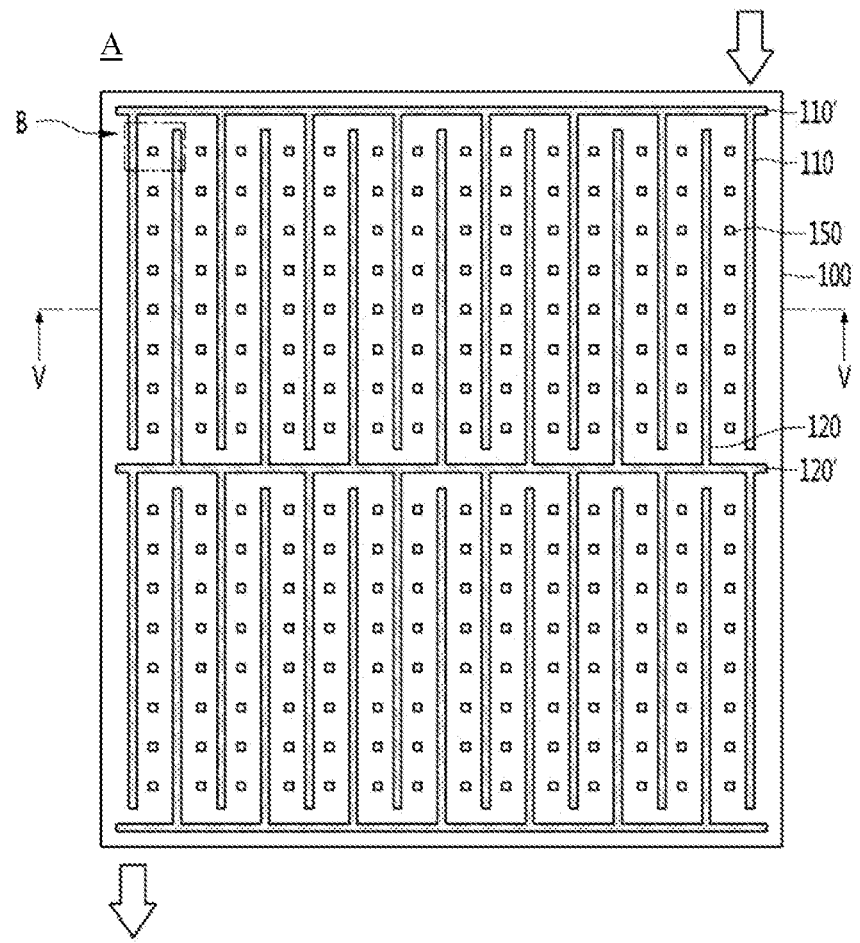
[FIG. 4]
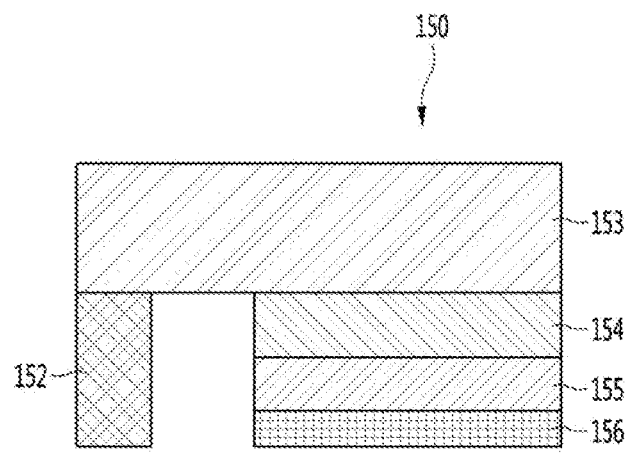

[FIG. 5]
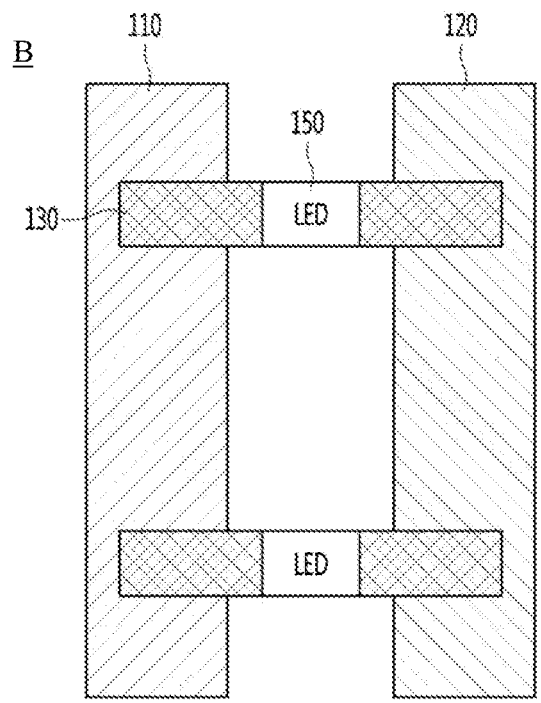
[FIG. 6]
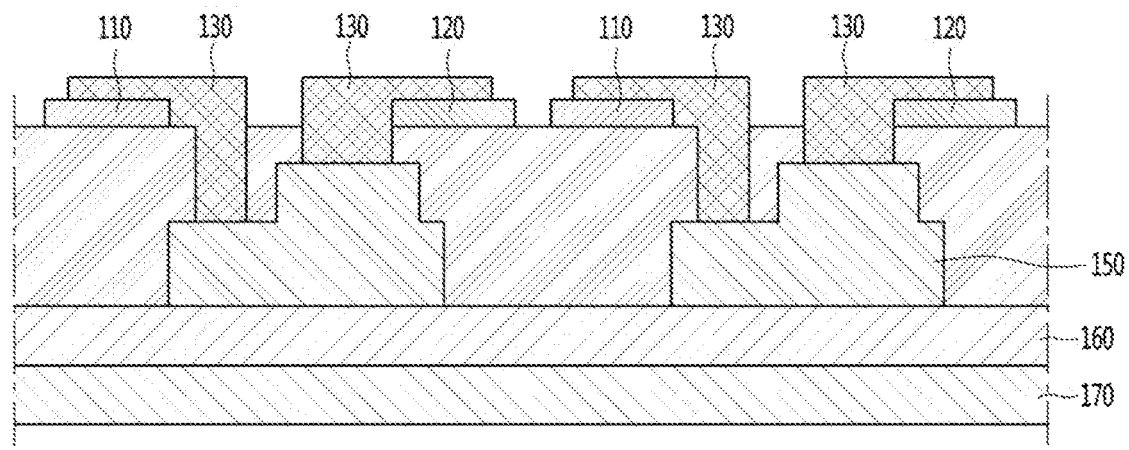

[FIG. 7]
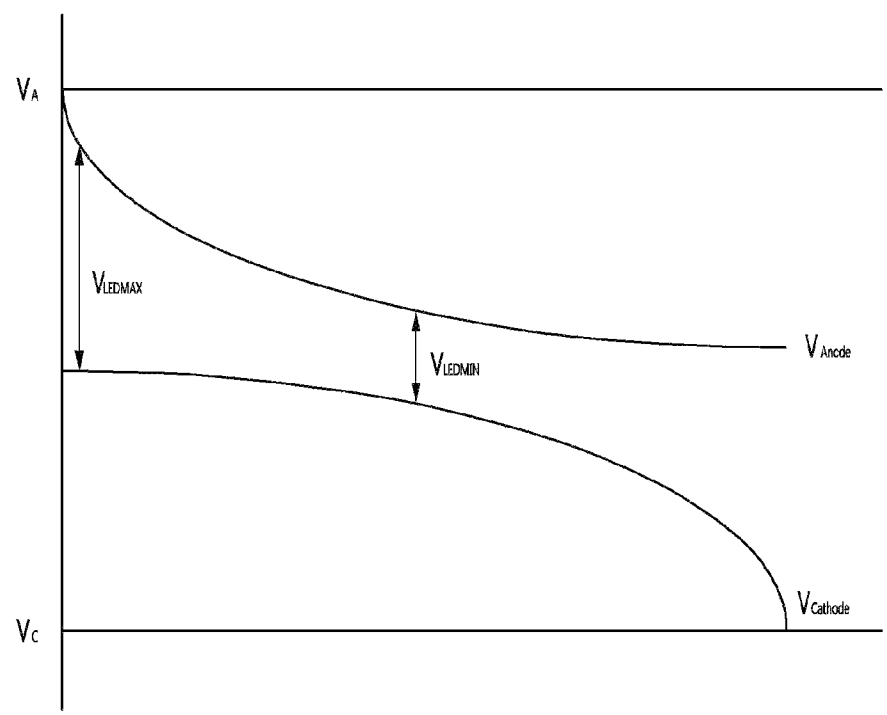

[FIG. 8]
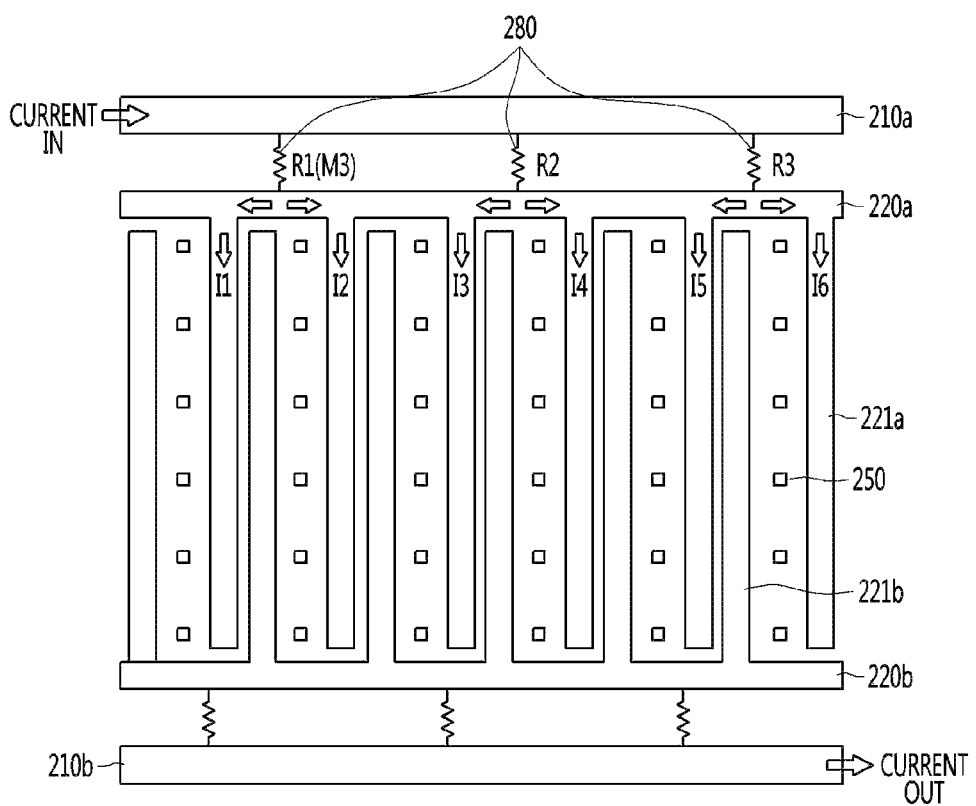

[FIG. 9]
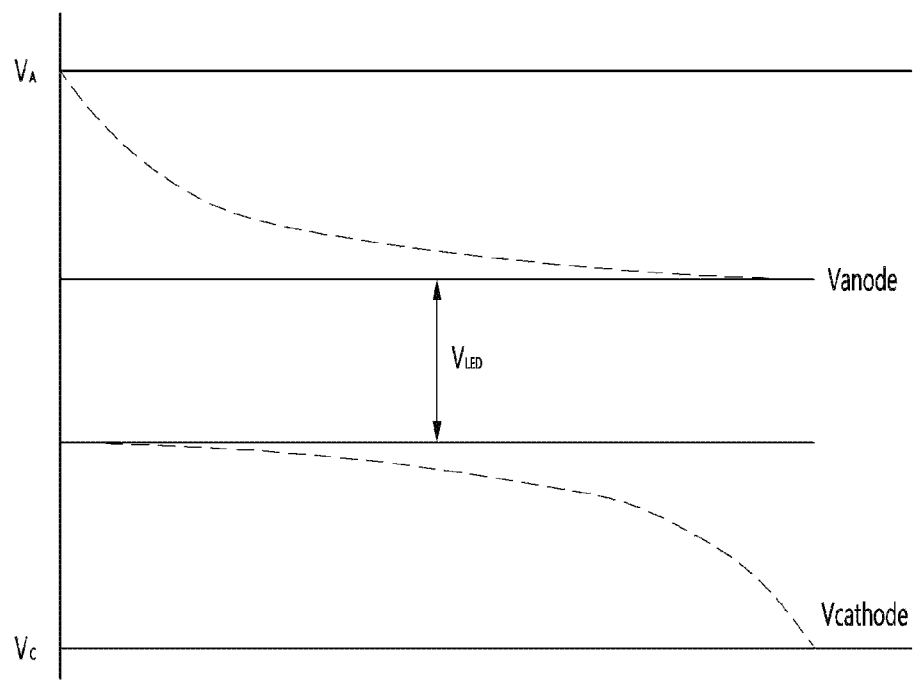

[FIG. 10]
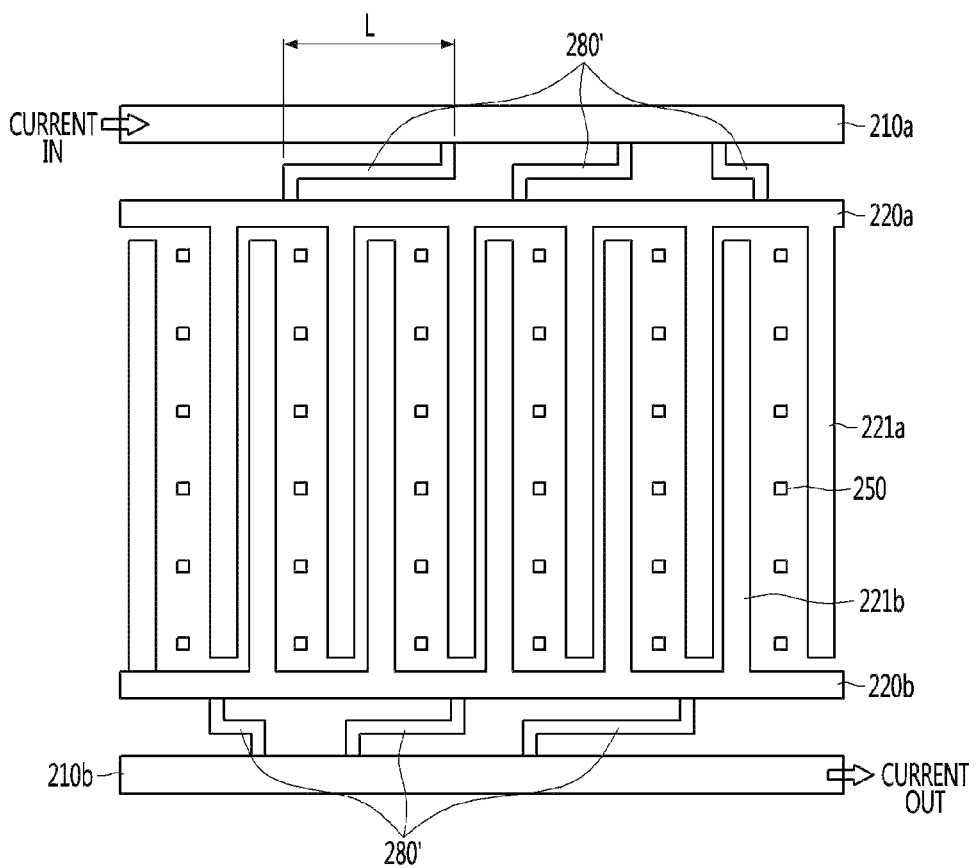

[FIG. 11]
(a) 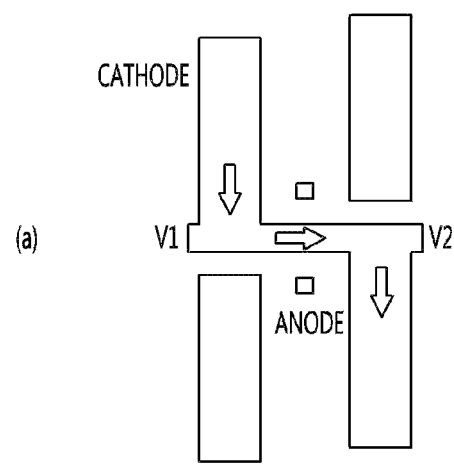
(b) 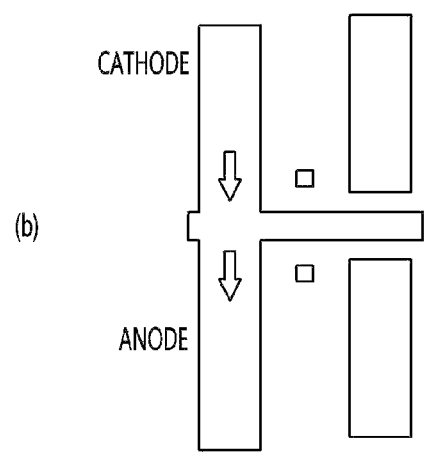

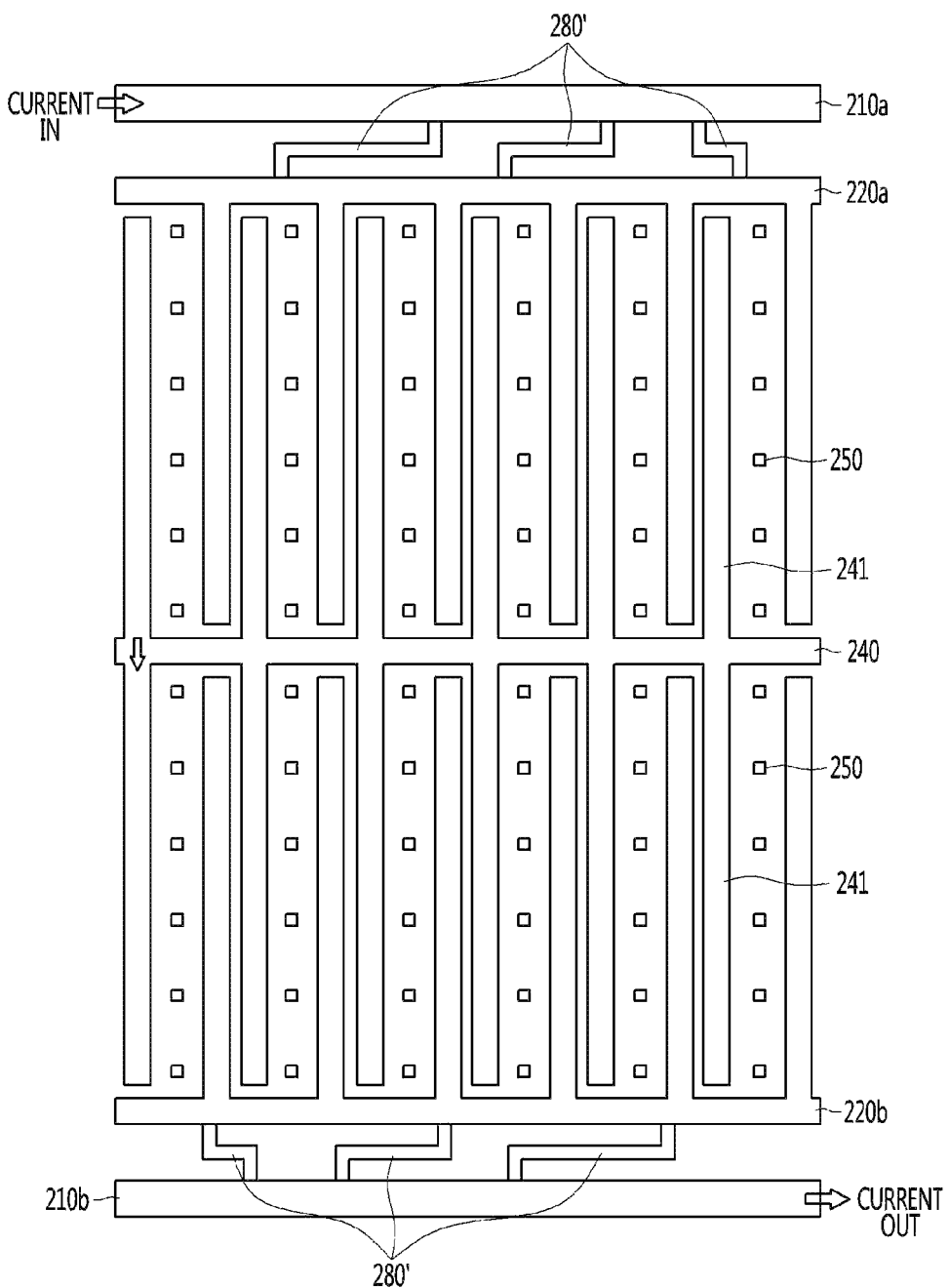
[FIG. 12]

[FIG. 13]
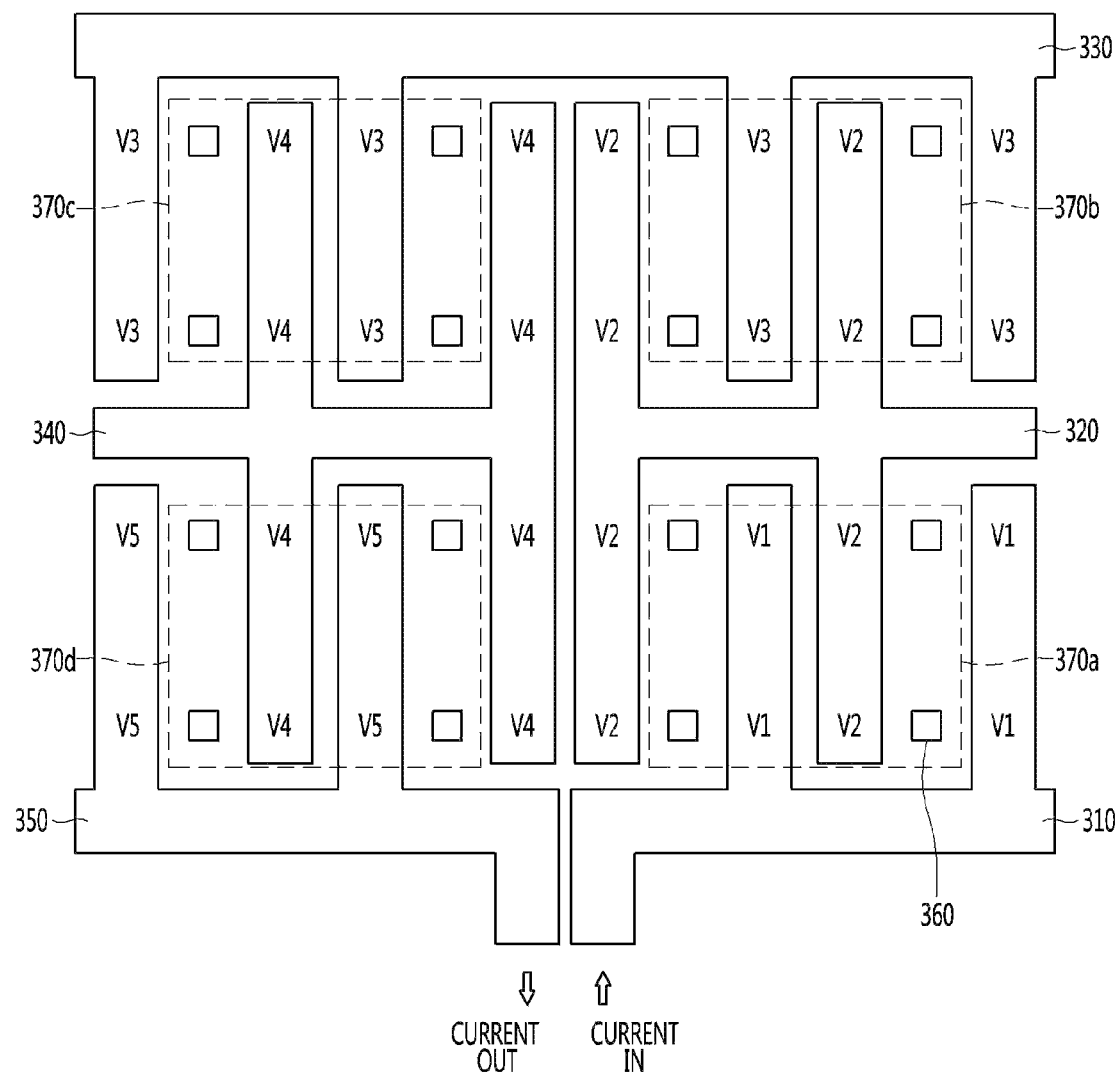

[FIG. 14]
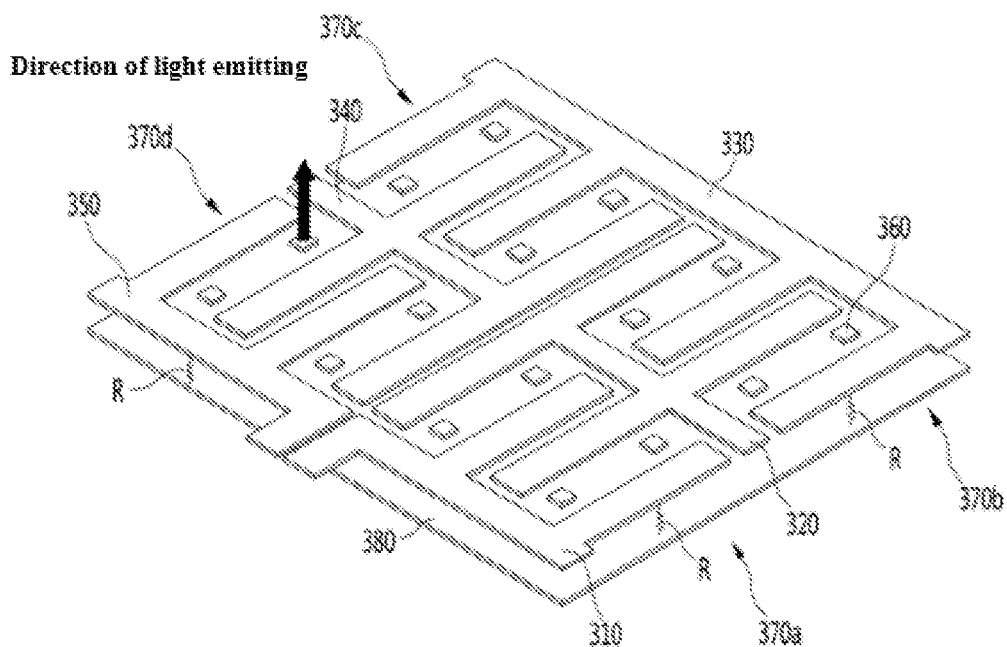
[FIG. 15]
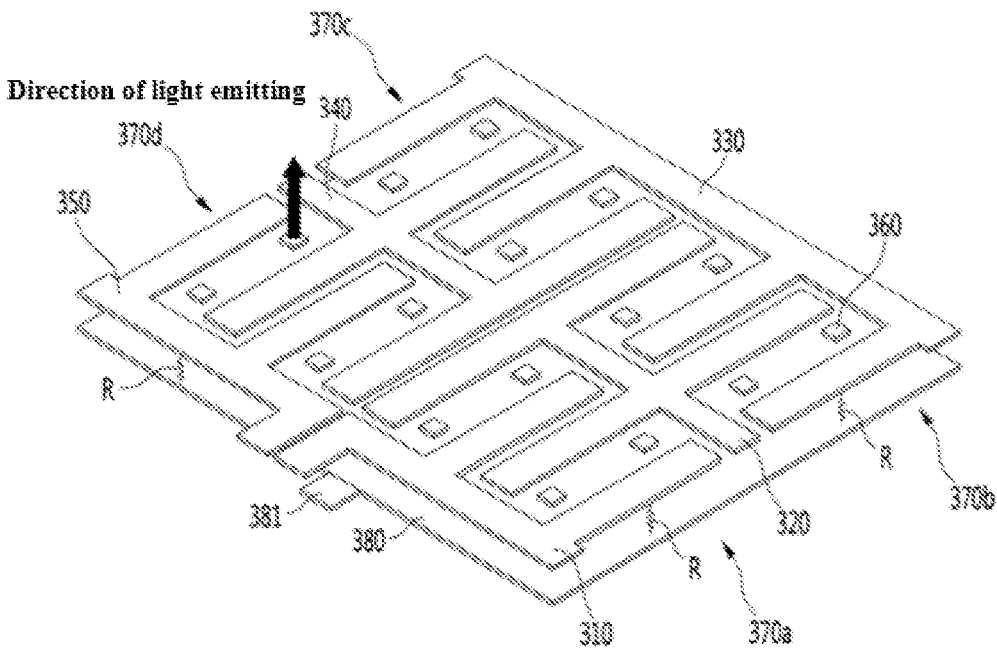

[FIG. 16]
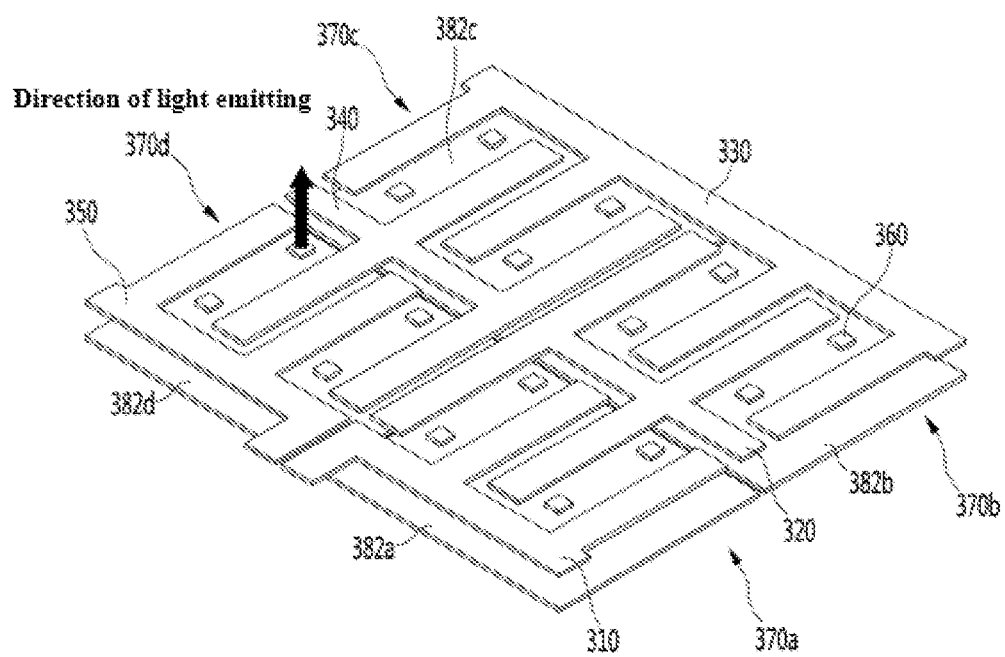
[FIG. 17]
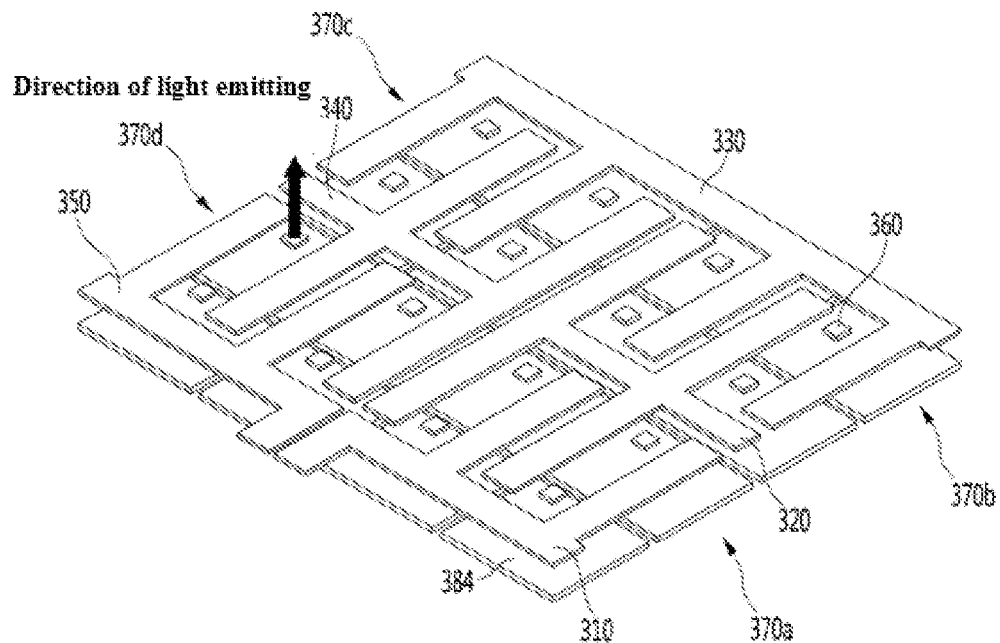

LIGHT EMITTING APPARATUS USING SEMICONDUCTOR LIGHT-EMITTING DEVICE

CROSS REFERENCE TO RELATED APPLICATIONS

This application is the National Stage filing under 35 U.S.C. 371 of International Application No. PCT/KR2019/014352, filed on Oct. 29, 2019, which claims the benefit of earlier filing date and right of priority to Korean Application No. 10-2018-0169630, filed on Dec. 26, 2018 in the Republic of Korea, the contents of all these applications being hereby incorporated by reference into the present application.

TECHNICAL FIELD

The present invention relates to a lamp using a semiconductor light emitting device.

BACKGROUND ART

Lamps that emit light are being used in various fields. For example, a vehicle is provided with various vehicle lamps having a lighting function or a signal function. Referring to FIG. 1, in general, the vehicle 1 has a lamp device 100 for stably securing the driver's visibility when the ambient illuminance is low during driving or for notifying other vehicles of the driving state of the vehicle 1.

The vehicle lamp device includes a head lamp installed at the front of the vehicle and a rear lamp installed at the rear of the vehicle. A headlamp is a lamp that illuminates the front and illuminates the front during night driving. The rear lamp includes a brake light that is turned on when a driver operates a brake, and a direction indicator light indicating a moving direction of the vehicle.

In general, a halogen lamp or a gas discharge lamp has been mainly used, but recently, a light emitting diode (LED) is attracting attention as a light source of a vehicle lamp.

The light emitting diode not only increases the design freedom of the lamp by minimizing its size, but also has economic efficiency due to its semi-permanent lifespan. However, most are currently being produced in the form of a package. A light emitting diode (LED) itself, not a package, is a semiconductor light emitting device that converts current into light, and is being developed as a light source for display images of electronic devices including information and communication devices.

Meanwhile, a lamp using a semiconductor light emitting device may include a reflection layer made of a metal material provided on a surface opposite to the light emitting direction of the semiconductor light emitting device. When power is supplied to the electrode lines disposed on the wiring board of the lamp, a voltage due to leakage current may be applied between the electrode lines and the reflection layer.

For example, in a high-temperature and high-humidity environment, the applied voltage may increase due to the leakage current, and in this case, there is a risk that lighting failure of the semiconductor light emitting device may occur.

Also, the voltages of the electrode lines may be different from each other, and accordingly, the voltage applied to the reflection layer by the leakage current may be different for each region. As a result, the reflection layer may be damaged, such as the metal of the reflection layer is peeled off.

As a result, there is a possibility that the reliability of the lamp may be deteriorated due to the above problems.

DISCLOSURE

Technical Problem

An object of the present invention is to provide a lamp using a semiconductor light emitting device capable of preventing a decrease in reliability due to leakage current between an electrode line and a reflection layer.

Technical Solution

A lamp according to an embodiment of the present invention may include a wiring board, a plurality of wiring electrodes disposed on the wiring board, a plurality of semiconductor light emitting devices connected between two wiring electrodes among the plurality of wiring electrodes, and a reflection layer of a metal material disposed under the wiring board, wherein the plurality of wiring electrodes are connected in series with each other by the plurality of semiconductor light emitting devices, and at least one of the plurality of semiconductor light emitting devices can be connected between two consecutive wiring electrodes among the plurality of wiring electrodes.

According to an embodiment, the plurality of semiconductor light emitting devices may be divided into at least one group, and at least one semiconductor light emitting device included in the same group may be connected in parallel between the same two wiring electrodes.

According to an embodiment, the reflection layer may be provided with a power connection part for supplying power to the reflection layer. When power is supplied to the plurality of wiring electrodes and the plurality of semiconductor light emitting devices, power may be supplied to the reflection layer through the power connection part.

A voltage applied to the reflection layer may be greater than or equal to a highest voltage among voltages applied to the plurality of wiring electrodes.

According to an embodiment, the power connection part may have a form in which a portion of the reflection layer is extended, or a form in which a metal of the same material as the reflection layer is connected to the reflection layer.

In some embodiments, the reflection layer may include a plurality of partial reflection layers spaced apart from each other in a horizontal direction.

According to an embodiment, the plurality of semiconductor light emitting devices can be divided into a plurality of groups, and at least one semiconductor light emitting device included in the same group is connected in parallel between the same two wiring electrodes, and the number of the plurality of partial reflective layers is equal to the number of the plurality of groups.

Each of the plurality of partial reflection layers may be disposed to correspond to one different group.

In some embodiments, the number of the plurality of partial reflection layers may be the same as the number of the plurality of semiconductor light emitting devices. Each of the plurality of partial reflection layers may be disposed to correspond to any one semiconductor light emitting device that is different from each other.

The lamp may further include a plurality of transparent electrodes connected between the plurality of wiring electrodes and the plurality of semiconductor light emitting devices.

The lamp may further include an insulating layer disposed between the wiring board and the reflection layer.

Advantageous Effects

According to an embodiment of the present invention, the lamp can be connected to a power source to the reflection layer to apply a predetermined voltage, thereby minimizing metal peeling of the wiring electrodes and preventing deterioration of the reliability of the lamp.

According to an embodiment of the present invention, the reflection layer provided in the light source unit of the lamp may be divided into a plurality of partial reflection layers so that different voltages are applied. Accordingly, the deviation between the voltage of each of the plurality of partial reflection layers and the voltage of the wiring electrodes corresponding to each of the plurality of partial reflection layers is reduced, thereby effectively reducing the electrochemical reaction and improving the reliability of the lamp.

DESCRIPTION OF DRAWINGS

FIG. 1 is a conceptual diagram illustrating a vehicle.

FIG. 2 is a cross-sectional view of a lamp device included in the vehicle.

FIG. 3 is a plan view of area A of FIG. 2.

FIG. 4 is a conceptual diagram illustrating a flip chip semiconductor light emitting device.

FIG. 5 is an enlarged view of area B of FIG. 3.

FIG. 6 is a cross-sectional view taken along line V-V of FIG. 3.

FIG. 7 is a graph showing a magnitude of a voltage applied to the semiconductor light emitting device according to a distance between a bus electrode and the semiconductor light emitting device in the lamp described in FIG. 3.

FIG. 8 is a conceptual diagram illustrating an embodiment of a lamp related to the present invention.

FIG. 9 is a graph illustrating the voltage drop prevention effect of the lamp shown in FIG. 8.

FIG. 10 is a conceptual diagram illustrating another embodiment of a connection electrode provided in a lamp related to the present invention.

FIG. 11 is a conceptual diagram illustrating the presence or absence of a voltage drop according to a structure of a bus electrode.

FIG. 12 is a conceptual diagram illustrating another embodiment of a lamp related to the present invention.

FIG. 13 is a conceptual diagram illustrating a lamp having a series-parallel electrode connection structure according to an embodiment of the present invention.

FIG. 14 is a perspective view illustrating electrode lines, semiconductor light emitting devices, and a reflection layer of the lamp shown in FIG. 13.

FIG. 15 is a diagram illustrating an embodiment of a reflection layer connected to an external power source according to an embodiment of the present invention.

FIG. 16 is a view showing another embodiment of a reflection layer provided in the lamp shown in FIG. 14.

FIG. 17 is a view showing another embodiment of a reflection layer provided in the lamp shown in FIG. 14.

MODE FOR INVENTION

Hereinafter, the embodiments disclosed in the present specification will be described in detail with reference to the accompanying drawings, but the same or similar elements are assigned the same reference numerals regardless of reference numerals, and redundant description thereof will be omitted. The suffixes "module" and "part" for the elements used in the following description are given or mixed in consideration of only the ease of writing the specification, and do not have distinct meanings or roles by themselves.

In addition, in describing the embodiments disclosed in the present specification, if it is determined that detailed descriptions of related art technologies may obscure the meaning of the embodiments disclosed in this specification, the detailed description thereof will be omitted. In addition, it should be noted that the accompanying drawings are only for easy understanding of the embodiments disclosed in the present specification, and should not be construed as limiting the technical spirit disclosed in the present specification by the accompanying drawings.

It is also understood that when an element, such as a layer, region, or substrate, is referred to as being "on" another element, it may be directly on the other element or intervening elements therebetween.

On the other hand, the lamp described in the present specification may be applied to a mobile phone, a smart phone, a laptop computer, a digital broadcasting terminal, a PDA (personal digital assistants), a PMP (portable multimedia player), a navigation, a slate PC, a Tablet PC, an Ultra Book, a digital TV, a desktop computer, and the like. However, those skilled in the art will readily appreciate that the configuration according to the embodiment described in the present specification may be applied to a lamp, even if it is a new product form to be developed later.

Meanwhile, the lamp described in this specification may be utilized for a vehicle. The vehicle lamp may include a headlamp, a tail lamp, a side lamp, a fog lamp, a turn signal lamp, a brake lamp, an emergency lamp, and a reversing lamp and the like.

FIG. 2 is a cross-sectional view of a lamp device included in a vehicle.

A vehicle lamp 10 according to an embodiment of the present invention may include a frame 11 fixed to a vehicle body and a light source unit 12 installed on the frame 11.

A wiring line for supplying power to the light source unit 12 may be connected to the frame 11, and the frame 11 may be directly fastened to the vehicle body or fixed through a bracket. As illustrated, a lens unit may be provided in order to more diffuse and sharpen the light emitted by the light source unit 12.

The light source unit 12 may be a flexible light source unit that can be bent, crooked, twisted, folded, or rolled by an external force.

In a state in which the light source unit 12 is not bent (eg, a state having an infinite radius of curvature, hereinafter referred to as a first state), the light source unit 12 may be flat. In a state bent by an external force in the first state (for example, a state having a finite radius of curvature, hereinafter referred to as a second state), the flexible light source unit may have a curved surface at least partially curved or curved.

The pixel of the light source unit 12 may be implemented by a semiconductor light emitting device. In the present invention, a light emitting diode (LED) is exemplified as a type of a semiconductor light emitting device that converts current into light. The light emitting diode is formed in a small size, so that it can serve as a pixel even in the second state.

Meanwhile, the light source unit 12 according to the present invention may include a unit light source, a base substrate, and a connection electrode. Hereinafter, the above-described elements will be described in detail.

The light source unit 12 may be comprised of only the unit light source. Hereinafter, the unit light source will be described in detail through the light source unit 12 made of only the unit light source.

FIG. 3 is a plan view of region A of FIG. 2, FIG. 4 is a conceptual diagram illustrating a flip chip semiconductor light emitting device, FIG. 5 is an enlarged view of region B of FIG. 3, and FIG. 6 is a cross-section taken view taken along line V-V of FIG. 3.

As shown, the light source unit 12 may include a wiring board 100, a plurality of electrode lines 110 and 120, a transparent electrode 130, and a semiconductor light emitting device 150. Hereinafter, the above-described elements will be described in detail.

Referring to FIG. 3, a plurality of electrode lines may be disposed on the wiring board. Each of the electrode lines 110 and 120 may protrude from the bus electrodes 110' and 120' and extend in one direction to form a bar shape. Meanwhile, each of the electrode lines 110 and 120 has one end formed opposite to the bus electrode.

When each of the electrode lines 110 and 120 is described in the form of a bar having both ends, one end of the electrode line is connected to the bus electrode, and the other end is disposed opposite the bus electrode. Meanwhile, in the present specification, an intermediate point between the two ends is referred to as a central portion of the electrode line.

Meanwhile, two types of bus electrodes 110' and 120' may be disposed on the wiring board. Specifically, a voltage applied between the two bus electrodes 110' and 120' is applied to each of the semiconductor light emitting devices 150. Through this, each of the semiconductor light emitting devices 150 emits light. The electrode lines 110 and 120 extending from each of the two bus electrodes 110' and 120' can be electrically connected to the semiconductor light emitting devices 150 such that the voltage applied between the two bus electrodes 110' and 120' may be applied to each of the semiconductor light emitting devices 150.

At this time, the individual semiconductor light emitting device 150 should be electrically connected to each of the two types of electrode lines 110' and 120'. Before describing the structure in which the semiconductor light emitting device 150 is electrically connected to the electrode lines, the structure of the semiconductor light emitting device 150 will be firstly described.

Referring to FIG. 4, the semiconductor light emitting device 150 may be a flip chip type light emitting device.

For example, the semiconductor light emitting device may include a p-type electrode 156, a p-type semiconductor layer 155 on which the p-type electrode 156 is formed, an active layer 154 disposed on the p-type semiconductor layer 155, an n-type semiconductor layer 153 disposed on the active layer 154, and an n-type electrode 152 spaced apart from the p-type electrode 156 in the horizontal direction on the n-type semiconductor layer 153. In this case, the p-type electrode 156 may be electrically connected to the electrode line 110 extending from either of the two bus electrodes, and the n-type electrode 152 may be connected to an electrode line 120 extending from the other one of the two bus electrodes.

Referring to FIG. 6, in the lamp according to the present invention, the p-type electrode and the n-type electrode are disposed in the direction of the light emitting surface. That is, the light emitted from the lamp according to the present invention is emitted to the outside through the p-type electrode and the n-type electrode. Due to these structural features, in order to increase the amount of light of the lamp, the structure overlapping the semiconductor light emitting device should be minimized.

Meanwhile, the reflection layer 160 may be disposed on the opposite side of the light emitting surface of the semiconductor light emitting device to maximize the amount of light of the lamp. The reflection layer reflects light emitted from the semiconductor light emitting device and directed toward the lower side of the lamp to increase the amount of light of the lamp. Meanwhile, the reflection layer 160 may be disposed on the base substrate 170.

On the other hand, when the electrode line made of metal or alloy is directly electrically connected to the semiconductor light emitting device, the amount of light of the lamp may be reduced because the electrode line covers the light emitting surface of the semiconductor light emitting device. To prevent this, referring to FIGS. 5 and 6, each of the electrode lines 110 and 120 is electrically connected to the semiconductor light emitting device through the transparent electrode 130.

The transparent electrode 130 may be made of a material having high light transmittance and conductivity. For example, the transparent electrode 130 may be ITO. The transparent electrode 130 has very high light transmittance than the electrode line, but has a little poor electrical conductivity. As shown in FIG. 6, when the semiconductor light emitting device 150 overlaps the transparent electrode, a decrease in the amount of light from the lamp can be minimized.

The lamp according to the present invention may include a power supply for applying a current to the semiconductor light emitting devices 150. The power supply unit applies a current to the bus electrode, and the applied current flows to the semiconductor light emitting devices along a plurality of electrode lines. However, when the power supply unit applies a current to one end of the bus electrode, the amount of current flowing through each of the electrode lines arranged in a row is different from each other. This is due to the voltage drop across each of the electrode lines. For this reason, voltage non-uniformity as shown in FIG. 7 can be generated.

FIG. 7 is a graph showing the magnitude of a voltage applied to a semiconductor light emitting device according to a distance between a bus electrode and a semiconductor light emitting device in the lamp described in FIG. 3.

As shown in the figure, as the semiconductor light emitting device moves away from the bus electrode, it gradually decreases and then increases again. That is, the voltage applied to the semiconductor light emitting device adjacent to the central portion of the electrode line is smaller than the voltage applied to the semiconductor light emitting device adjacent to both ends of the electrode line. Accordingly, the amount of light emitted from the semiconductor light emitting device varies depending on the position of the semiconductor light emitting device. As the area of the lamp increases, the difference in the amount of light becomes more evident.

The present invention proposes a structure for solving the problem that the amount of light of a semiconductor light emitting device varies depending on the position of the semiconductor light emitting device due to a voltage drop. The lamp according to the present invention may include all of the elements described with reference to FIGS. 3 to 6.

FIG. 8 is a conceptual diagram illustrating an embodiment of the lamp according to the present invention, and FIG. 9 is a graph illustrating the voltage drop prevention effect of the lamp according to the present invention.

Although the above-described transparent electrode is not illustrated in FIG. 8, as described in FIG. 5, the electrode line can be electrically connected to the semiconductor light emitting device through the transparent electrode. Hereinafter, all of the drawings to be described are illustrated by omitting the transparent electrode, but all electrode lines can be electrically connected to the semiconductor light emitting device through the transparent electrode.

A lamp according to the present invention may include a wiring board, a bus electrode, a plurality of electrode lines, a plurality of semiconductor light emitting devices, a plurality of transparent electrodes, and a current injection unit. The wiring board, the plurality of light emitting devices, and the plurality of transparent electrodes are replaced with descriptions of FIGS. 1 to 7.

In the present invention, a current injection part 210*a* can be separately used instead of applying a current to the wiring electrode 220*a* directly from the power supply unit. Referring to FIG. 8, the current injection part 210*a* can be formed to extend along one direction in which the bus electrode 220*a* extends, and is disposed parallel to the bus electrode 220*a*.

The current injection part 210*a* can be electrically connected to the bus electrode 220*a*. For this purpose, the present invention can include a plurality of connection electrodes 280. The connection electrodes 280 can be disposed between the bus electrode 220*a* and the current injection part 210*a*. The plurality of connection electrodes 280 can be disposed to be spaced apart from each other by a predetermined distance along one direction in which the bus electrode 220*a* extends. A current applied from the power supply can be applied to the bus electrode 220*a* along each of the plurality of connection electrodes 280.

Meanwhile, the resistance values of each of the connection electrodes 280 may be different from each other. Specifically, the resistance value of each of the connection electrodes 280 may decrease as the distance from the power supply increases. This is to compensate for the voltage drop that occurs as the distance from the power supply is increased. Through this, according to the present invention, the same current can be applied to each of all the electrode lines 221*a* extending from the wiring electrode 220*a*.

When the currents applied to each of the electrode lines 221*a* are the same, the voltages applied to each of the semiconductor light emitting devices 250 become the same as shown in FIG. 9. Through this, according to the present invention, the same amount of light can be emitted regardless of the position where the semiconductor light emitting device 250 is disposed. Also shown in FIG. 8, for example, are electrode lines 221*b*, a wiring electrode 220*b*, and a current extraction part 210*b*.

Meanwhile, the present invention provides various modified embodiments for sequentially changing the resistance value of the connection electrode.

FIG. 10 is a conceptual diagram illustrating a modified embodiment of a connection electrode provided in a lamp according to the present invention.

Referring to FIG. 10, the connection electrode 280' according to the present invention may include a first connection part connected to a current injection part 210*a*, a resistor part extending from one end of the first connection part along the one direction, and a second connection part extending from one end of the resistor part and connected to the wiring electrode.

The present invention can change the shape of the resistor part to change the resistance value of the connection electrode. In an embodiment, the length L of the resistor part provided in each of the connection electrodes 280' may be different from each other. In detail, the length of the resistor part provided in each of the connection electrodes 280' may be shorter as the distance from the power supply increases. As the length of the resistance portion decreases, the resistance value of the connection electrode 280' decreases. According to the above-described structure, the connection electrode having a lower resistance value is disposed as the distance from the power supply unit increases.

In another embodiment, the width of the resistor part may become thinner as it moves away from the power supply. As the width of the resistance portion decreases, the resistance value of the connection electrode 280' decreases. According to the above-described structure, the connection electrode having a lower resistance value is disposed as the distance from the power supply unit increases.

As described above, in the present invention, the resistance values of the connection electrodes are variously adjusted by utilizing the space between the wiring electrode and the current injection unit. Through this, according to the present invention, it is possible to minimize the area of the non-emission area of the lamp and increase the light uniformity of the lamp.

On the other hand, the present invention can improve the light uniformity of the lamp by crossing the wiring connected to the semiconductor light emitting device.

FIG. 11 is a conceptual diagram illustrating the presence or absence of a voltage drop according to the structure of a bus electrode, and FIG. 12 is a conceptual diagram illustrating a modified embodiment according to the present invention.

The wiring electrode provided in the lamp according to the present invention may include a first wiring electrode arranged in parallel with the current injection unit and a second wiring electrode arranged to be spaced apart from the first wiring electrode by a predetermined distance.

Here, the first wiring electrode corresponds to the wiring electrode 110 shown in the upper part of FIG. 4, and the second wiring electrode corresponds to the wiring electrode 120 shown in the center part of FIG. 4. All regions of the second wiring electrode should be formed as equipotential surfaces, but referring to FIG. 11 (*a*), a voltage drop occurs between V1 and V2. This adversely affects the light uniformity of the lamp.

To prevent this, in the present invention, as shown in FIG. 11 (*b*), the electrode line extends in both directions at the same point of the wiring electrode. In this case, an electrode extending in the first direction is used as a cathode, and an electrode extending in a second direction opposite to the first direction is used as an anode. To this end, the semiconductor light emitting device disposed on the upper side and the semiconductor light emitting device disposed below the wiring electrode are disposed in a state inverted by 180 degrees from each other.

Specifically, the p-type electrode of the semiconductor light emitting device disposed above the wiring electrode of FIG. 11(*b*) can be electrically connected to the electrode line disposed on the left side of the semiconductor light emitting device. In contrast, the p-type electrode of the semiconductor light emitting device disposed below the wiring electrode of FIG. 11 (*b*) can be electrically connected to the electrode line disposed on the right side of the semiconductor light emitting device.

When the structure of FIG. 11 (*b*) is applied to the entire lamp, it has the same structure as that of FIG. 12. As shown, the first wiring electrode 220*a* can be electrically connected to the current injection part 210*a*, and two types of electrode lines can be disposed on the second bus electrode 240. Specifically, a first electrode line extending 241 in a first direction and a second electrode line 241 extending in a second direction opposite to the first direction are disposed on the second bus electrode 240. Here, the second electrode line is formed extending from the same point as the point where the first electrode line is formed.

The first and second electrode lines can be formed to extend in both directions from one point of the second bus electrode 240. A p-type electrode of the semiconductor light emitting device can be connected to one of the first and second electrode lines, and an n-type electrode can be connected to the other. Through this, it is possible to prevent a voltage deviation from occurring in the second wiring electrode 240.

As described above, according to the present invention, since a uniform voltage is applied to the semiconductor light emitting devices provided in the lamp, each of the semiconductor light emitting devices provided in the lamp can emit light with the same brightness.

FIG. 13 is a conceptual diagram illustrating a lamp having a series-parallel connection structure according to an embodiment of the present invention.

Although the transparent electrode described above is not shown in FIG. 13, as described in FIG. 5, the electrode line (wiring electrode) can be electrically connected to the semiconductor light emitting device through the transparent electrode.

A lamp according to an embodiment of the present invention may include a light source unit including a wiring board, a plurality of wiring electrodes, a plurality of semiconductor light emitting devices, a plurality of transparent electrodes, a reflection layer, and the like. The wiring board, the plurality of semiconductor light emitting devices, and the plurality of transparent electrodes are replaced with the description of FIGS. 1 to 7.

Meanwhile, although FIG. 13 illustrates the light source unit 300 including a unit light source, according to an embodiment, the light source unit 300 may include a plurality of unit light sources arranged in an array form.

Referring to FIG. 13, the light source unit 300 may include a plurality of wiring electrodes 310, 320, 330, 340, and 350, and a plurality of semiconductor light emitting devices 360 connected between two of the plurality of wiring electrodes.

Similar to that described above in FIG. 3, each of the plurality of wiring electrodes 310 to 350 may include a bus electrode and electrode lines protruding from the bus electrode and extending in one direction to form a bar shape. Each of the bus electrodes may be parallel to each other. The electrode lines may be electrically connected to the semiconductor light emitting devices 360.

Meanwhile, the plurality of semiconductor light emitting devices 360 may be connected in series and parallel form through the plurality of wiring electrodes 310 to 350. In other words, the plurality of wiring electrodes 310 to 350 may be serially connected to each other through the plurality of semiconductor light emitting devices 360 and transparent electrodes.

As shown in FIG. 13, semiconductor light emitting devices included in the first group 370a among the plurality of semiconductor light emitting devices 360 may be connected between the first wiring electrode 310 and the second wiring electrode 320. The semiconductor light emitting devices included in the second group 370b may be connected between the second wiring electrode 320 and the third wiring electrode 330, and the semiconductor light emitting devices included in the third group 370c may be connected between the third wiring electrodes 330 and the fourth wiring electrode 340. And the semiconductor light emitting devices included in the fourth group 370d may be connected between the fourth wiring electrode 340 and the fifth wiring electrode 350.

That is, it can be seen that the semiconductor light emitting devices included in the same group are connected in parallel between the same wiring electrodes. Also, it can be seen that each of the groups 370a to 370d is connected in series through the wiring electrodes 310 to 350. Accordingly, the plurality of semiconductor light emitting devices 360 included in the light source unit 300 may be connected according to a series-parallel connection structure. Accordingly, the uniformity of light emitted from the plurality of semiconductor light emitting devices 360 provided in the light source unit 300 may be secured.

When the light source unit 300 is driven, current may be supplied to the first wiring electrode 310 among the plurality of wiring electrodes 310 to 350. For example, a first voltage V1 can be applied to the first wiring electrode 310 to supply current, and a fifth voltage V5 lower than the first voltage V1 can be applied to the fifth wiring electrode 350. The fifth voltage V5 may be 0V, but is not limited thereto.

As the first voltage V1 is applied to the first wiring electrode 310 and the fifth voltage V5 is applied to the fifth wiring electrode 350, current flows from the first wiring electrode 310 to the fifth wiring electrode 350. In this case, assuming that the characteristics of the plurality of semiconductor light emitting devices 360 are identical to each other, the magnitude of the voltage dropped between the respective wiring electrodes may be substantially the same.

Accordingly, the second voltage V2 which is lowered from the first voltage V1, can be applied to the second wiring electrode 320, a third voltage V3 which is a voltage of the predetermined magnitude has been dropped from the second voltage V2 can be applied to the third wiring electrode 330. A fourth voltage V4 in which the voltage of the predetermined magnitude is lowered from the third voltage V3 may be applied to the fourth wiring electrode 340. In addition, the fifth voltage V5 may be smaller than the fourth voltage V4 by the predetermined level.

FIG. 14 is a perspective view illustrating wiring electrodes, semiconductor light emitting devices, and a reflection layer of the lamp shown in FIG. 13.

Referring to FIG. 14, as described above with reference to FIG. 6, a reflection layer 380 may be provided under the wiring board on which the wiring electrodes 310 to 350 and the plurality of semiconductor light emitting devices 360 are formed.

Also, although not shown, an insulating layer (not shown) may be disposed between the wiring board and the reflection layer 380. An insulating resistor R may be disposed between the wiring board and the reflection layer 380 by the insulating layer. The insulation resistor R may be formed at various positions between the wiring board and the reflection layer 380.

When a voltage is applied to the wiring electrodes 310 to 350 and the plurality of semiconductor light emitting devices 360 according to the driving of the light source unit 300, a minute leakage current may be generated from the wiring electrodes 310 to 350, and a voltage may be applied to the reflection layer 380 by the leakage current. For example, the magnitude of the voltage applied to the reflection layer 380 may be an intermediate value between the first voltage V1 and the fifth voltage V5 (or an average value of the first voltage V1 to the fifth voltage V5), this is not necessarily the case.

Meanwhile, since the voltages applied to each of the wiring electrodes 310 to 350 are different from each other, the voltage between the wiring electrodes 310 to 350 and the reflection layer 380 may be different for each location. For example, assuming that the first voltage V1 to the fifth voltage V5 are sequentially 40V, 30V, 20V, 10V, and 0V, and the voltage applied to the reflection layer 380 is 20V, a voltage of 20V may be applied between the first wiring electrode 310 and the reflection layer 380. Also, a voltage of 10V may be applied between the second wiring electrode 320 and the reflection layer 380, and a voltage of 0V may be applied between the third wiring electrode 330 and the reflection layer 380. Also, a voltage of −10V may be applied between the fourth wiring electrode 340 and the reflection layer 380 and a voltage of −20V may be applied between the fifth wiring electrode 350 and the reflection layer 380.

The maximum voltage deviation applied between the wiring electrodes 310 to 350 and the reflection layer 380 may increase as the number of the wiring electrodes increases. Due to the voltage deviation, an electrochemical phenomenon such as ionic-migration or electro-migration may occur between the wiring electrodes 310 to 350 and the reflection layer 380. The electrochemical phenomenon may occur more actively as the voltage deviation increases. In this case, metals (copper, gold, etc.) included in the wiring electrodes 310 to 350 may be peeled off in the form of metal ions. In particular, the ion migration or electric migration may occur in the wiring electrodes (e.g., the first wiring electrode 310 and the second wiring electrode 320) having a voltage higher than the voltage of the reflection layer 380.

As the metal of the wiring electrode is peeled off, an electrical loss may occur when a current is supplied, or the semiconductor light emitting device 360 may not be lit normally.

Also, the lamp may be in contact with or adjacent to an external environment (such as the atmosphere) to emit light to the outside. In this case, the electrochemical phenomenon may more actively occur according to a change in the external environment (e.g., an increase in temperature and/or humidity). These problems may cause a decrease in the reliability of the lamp.

Various embodiments for solving the above problems will be described below with reference to FIGS. 15 to 17.

FIG. 15 is a diagram illustrating an embodiment of a reflection layer connected to an external power source according to an embodiment of the present invention.

Referring to FIG. 15, the reflection layer 380 may include a power connection part 381 connected to an external power source. The power connection part 381 may be implemented in a form in which a part of the reflection layer 380 is extended, or a metal of the same material as the reflection layer 380 is connected to each other.

In this case, a voltage may be applied to the reflection layer 380 by an external power source connected through the power connection part 381. In particular, the voltage applied by the external power source may be applied to minimize peeling of the metal included in the wiring electrodes 310 to 350.

The voltage applied by the external power source may be equal to or greater than the voltage of the wiring electrode (e.g., the first wiring electrode 310) to which the highest voltage among the wiring electrodes 310 to 350 is applied.

For example, when each of the first voltages V1 to V5 is sequentially 40V, 30V, 20V, 10V, and 0V, a voltage of 40V may be applied to the reflection layer 380. In this case, the voltage applied between the first wiring electrode 310 and the reflection layer 380 is 0V, and the voltage applied between the second wiring electrode 320 and the reflection layer 380 is −10V. In addition, the voltage applied between the third wiring electrode 330 and the reflection layer 380 is −20V, the voltage applied between the fourth wiring electrode 340 and the reflection layer 380 is −30V, and the fifth wiring electrode, and a voltage applied between 350 and the reflection layer 380 may be −40V.

Since the voltages of the first wiring electrode 310 and the reflection layer 380 are the same, an occurrence of an electrochemical phenomenon between the first wiring electrode 310 and the reflection layer 380 may be minimized. Also, since the voltage of the second wiring electrode 320 to the fifth wiring electrode 350 is lower than the voltage of the reflection layer 380, the second wiring electrode 320 to the fifth wiring electrode 350 may correspond to the negative pole in relation to is the reflection layer 380. Accordingly, it is possible to prevent the metal included in the wiring electrodes 310 to 350 from being peeled off due to the migration phenomenon.

That is, according to the embodiment shown in FIG. 15, the lamp connects power to the reflection layer 380 and applies a predetermined voltage, thereby minimizing metal peeling of the wiring electrodes 310 to 350 to prevent deterioration of the reliability of the lamp. can FIG. 16 is a view showing another embodiment of a reflection layer provided in the lamp shown in FIG. 14.

Referring to FIG. 16, the reflection layer provided in the light source unit 300 of the lamp may include a plurality of partial reflection layers 382a to 382d separated from each other.

The plurality of partial reflection layers 382a to 382d may be separated to correspond to the groups 370a to 370d of the plurality of semiconductor light emitting devices 360. For example, the first partial reflection layer 382a may correspond to the region including the first group 370a, and the second partial reflection layer 382b may correspond to the region including the second group 370b. Also, the third partial reflection layer 382c may correspond to a region including the third group 370c, and the fourth partial reflection layer 382d may correspond to a region including the fourth group 370d.

In this case, a voltage corresponding to an intermediate value between the first voltage V1 of the first wiring electrode 310 and the second voltage V2 of the second wiring electrode 320 can be applied to the first partial reflection layer 382a. Similarly, a voltage corresponding to an intermediate value between the second voltage V2 and the third voltage V3 can be applied to the second partial reflection layer 382b, and a voltage corresponding to an intermediate value of the third voltage V3 and the fourth voltage V3 can be applied to the third partial reflection layer 382c. Also, a voltage corresponding to an intermediate value between the fourth voltage V4 and the fifth voltage V5 may be applied to the fourth partial reflection layer 382d.

Accordingly, a maximum voltage deviation between the wiring electrodes 310 to 350 and the partial reflection layers 382a to 382d can drop sharply than a maximum voltage deviation between the wiring electrodes 310 to 350 and the reflection layer 380 described in FIG. 14. As the voltage deviation decreases, the electrochemical reaction between the wiring electrodes 310 to 350 and the partial reflection layers 382a to 382d is reduced, so that the reliability of the lamp and the light source unit 300 due to metal peeling can be prevented.

FIG. 17 is a view showing another embodiment of a reflection layer provided in the lamp shown in FIG. 14.

Referring to FIG. 17, unlike the embodiment shown in FIG. 16, the reflection layer may include a plurality of partial reflection layers 384 separated to correspond to each of the plurality of semiconductor light emitting devices 360 provided in the light source unit 300.

In this case, similar to the embodiment of FIG. 16, a voltage applied to each of the plurality of partial reflection layers 384 may correspond to a median value of voltages applied to the corresponding wiring electrodes.

Accordingly, the maximum voltage deviation between the wiring electrodes 310 to 350 and the partial reflection layers 384 may be sharply lower than the maximum voltage deviation between the wiring electrodes 310 to 350 and the reflection layer 380 described above with reference to FIG. 14. As the voltage deviation decreases, the electrochemical reaction between the wiring electrodes 310 to 350 and the partial reflection layers 384 decreases, so that the reliability of the lamp and the light source unit 300 may be prevented from being deteriorated due to metal peeling or the like.

That is, according to the embodiment shown in FIGS. 16 to 17, the reflection layer provided in the light source unit 300 of the lamp may be divided into a plurality of partial reflection layers so that different voltages are applied thereto. Accordingly, the deviation between the voltage of each of the plurality of partial reflection layers and the voltage of the wiring electrodes corresponding to each of the plurality of partial reflection layers can be reduced, thereby effectively reducing the electrochemical reaction and improving the reliability of the lamp.

Meanwhile, although not shown, the embodiment of FIG. 15 and the embodiment of FIGS. 16 to 17 may be integrally applied to the reflection layer. That is, the reflection layer may be divided into a plurality of partial reflection layers, and each of the separated partial reflection layers may be connected to an external power source to receive power.

The above description is merely illustrative of the technical spirit of the present invention, and various modifications and variations will be possible without departing from the essential characteristics of the present invention by those skilled in the art to which the present invention pertains.

Therefore, the embodiments disclosed in the present invention are not intended to limit the technical spirit of the present invention, but to explain, and the scope of the technical spirit of the present invention is not limited by these embodiments.

The protection scope of the present invention should be construed by the following claims, and all technical ideas within the equivalent range should be construed as being included in the scope of the present invention.

The invention claimed is:

1. A light emitting apparatus comprising:
a plurality of wiring electrodes;
a plurality of semiconductor light emitting devices connected between two of the plurality of wiring electrodes; and
a reflection layer of metal disposed under the plurality of semiconductor light emitting devices,
wherein the plurality of wiring electrodes are connected in series with each other by the plurality of semiconductor light emitting devices,
wherein at least one of the plurality of semiconductor light emitting devices is connected between two consecutive wiring electrodes among the plurality of wiring electrodes,
wherein the plurality of wiring electrodes include a first wiring electrode, a second wiring electrode and a third wiring electrode,
wherein the second wiring electrode is interposed between the first wiring electrode and the third wiring electrode,
wherein the second wiring electrode includes a bus electrode extending in a first direction and a pair of electrode lines extending away from opposite sides of the bus electrode in a second direction intersecting the first direction,
wherein each of the plurality of wiring electrodes protrudes from a first bus electrode and a second bus electrode,
wherein the light emitting apparatus comprises a current injection part extending along one direction in which the first and second bus electrodes extend, and is disposed parallel to the first and second bus electrodes,
wherein the light emitting apparatus further comprises a plurality of connection electrodes disposed between the first and second bus electrodes and the current injection part, and
wherein resistance values of each of the plurality of connection electrodes are different from each other.

2. The light emitting apparatus according to claim 1, wherein the plurality of semiconductor light emitting devices are placed into at least one group, and at least two semiconductor light emitting devices included in the at least one group are connected in parallel between two identical wiring electrodes.

3. The light emitting apparatus according to claim 1, wherein the reflection layer is provided with a power connection part for supplying power to the reflection layer.

4. The light emitting apparatus according to claim 3, wherein when power is supplied to the plurality of wiring electrodes and the plurality of semiconductor light emitting devices, power is supplied to the reflection layer through the power connection part.

5. The light emitting apparatus according to claim 4, wherein a voltage applied to the reflection layer is greater than or equal to a highest voltage among voltages applied to the plurality of wiring electrodes.

6. The light emitting apparatus according to claim 3, wherein the power connection part has a form in which a part of the reflection layer is extended from another part of the reflection layer.

7. The light emitting apparatus according to claim 1, wherein the reflection layer includes a plurality of partial reflection layers spaced apart from each other in a horizontal direction.

8. The light emitting apparatus according to claim 7, wherein the plurality of semiconductor light emitting devices are divided into a plurality of groups,
wherein at least two semiconductor light emitting devices included in the same group are connected in parallel between two same wiring electrodes, and
wherein a number of the plurality of partial reflection layers is equal to that of the plurality of groups.

9. The light emitting apparatus according to claim 3, wherein the power connection part has a form in which a metal of the same material as that of the reflection layer is connected to the reflection layer.

10. The light emitting apparatus according to claim 3, wherein a voltage applied to the reflection layer is the same with a voltage applied to any one of the plurality of wiring electrodes.

11. The light emitting apparatus according to claim 3, wherein a voltage applied to any one of the plurality of wiring electrodes is less than a voltage applied to the reflection layer.

12. The light emitting apparatus according to claim 7, wherein a voltage applied to each of the plurality of partial reflection layers corresponds to a median value of voltages applied to a corresponding wiring electrode.

13. The light emitting apparatus according to claim 12, wherein a voltage corresponding to an intermediate value between a first voltage of the first wiring electrode of the plurality of wiring electrodes and the second voltage of a second wiring electrode of the plurality of wiring electrodes is applied to a first partial reflection layer of the plurality of partial reflection layers.

14. The light emitting apparatus according to claim 8, wherein a voltage applied to each of the plurality of partial reflection layers corresponds to a median value of voltages applied to a corresponding wiring electrode.

15. A electric device comprising:
the light emitting apparatus according to claim 1,
wherein the electric device is any one of a mobile phone, a smart phone, a laptop computer, a digital broadcasting terminal, a PDA (personal digital assistant), a PMP (portable multimedia player), a navigation, a slate PC (personal computer), a Tablet PC, an Ultra Book, a digital TV or a desktop computer.

16. The light emitting apparatus according to claim 1, wherein a resistance value of each of the plurality of connection electrodes decrease as a distance from a power supply increases.

17. A light emitting apparatus comprising:
a plurality of wiring electrodes;
a plurality of semiconductor light emitting devices connected between two of the plurality of wiring electrodes; and
a reflection layer of metal disposed under the plurality of semiconductor light emitting devices,
wherein the plurality of wiring electrodes are connected in series with each other by the plurality of semiconductor light emitting devices,
wherein at least one of the plurality of semiconductor light emitting devices is connected between two consecutive wiring electrodes among the plurality of wiring electrodes,
wherein the plurality of wiring electrodes include a first wiring electrode, a second wiring electrode and a third wiring electrode,
wherein the second wiring electrode is interposed between the first wiring electrode and the third wiring electrode,
wherein the second wiring electrode includes a bus electrode extending in a first direction and a pair of electrode lines extending away from opposite sides of the bus electrode in a second direction intersecting the first direction,
wherein each of the plurality of wiring electrodes protrudes from a first bus electrode and a second bus electrode,
wherein the light emitting apparatus comprises a current injection part extending along one direction in which the first and second bus electrodes extend, and is disposed parallel to the first and second bus electrodes,
wherein the light emitting apparatus comprises a plurality of connection electrodes disposed between the first and second bus electrodes and the current injection part,
wherein a resistance value of each of the plurality of connection electrodes decrease as a distance from a power supply increases, and
wherein each connection electrode includes a first connection part connected to the current injection part, a resistor part extending from one end of the first connection part along the one direction, and a second connection part extending from one end of the resistor part and connected to any one of the plurality of wiring electrodes.

18. The light emitting apparatus according to claim 17, wherein a length of the resistor part provided in each connection electrode is shorter as a distance from the power supply increases.

19. The light emitting apparatus according to claim 1, further comprising a wiring board on which the plurality of wiring electrodes are disposed,
wherein the reflection layer is disposed under the wiring board.

20. A light emitting apparatus comprising:
a plurality of wiring electrodes;
a plurality of semiconductor light emitting devices connected between two of the plurality of wiring electrodes; and
a reflection layer of metal disposed under the plurality of semiconductor light emitting devices,
wherein the plurality of wiring electrodes are connected in series with each other by the plurality of semiconductor light emitting devices,
wherein at least one of the plurality of semiconductor light emitting devices is connected between two consecutive wiring electrodes among the plurality of wiring electrodes,
wherein each of the plurality of wiring electrodes protrudes from a first bus electrodes and a second bus electrode,
wherein the light emitting apparatus further comprises a current injection part extending along one direction in which the first and second bus electrodes extend, and is disposed parallel to the first and second bus electrodes,
wherein the light emitting apparatus further comprises a plurality of connection electrodes disposed between the first and second bus electrodes and the current injection part, and
wherein resistance values of each of the plurality of connection electrodes are different from each other.

* * * * *